United States Patent
Nishihata et al.

(10) Patent No.: US 11,545,336 B2
(45) Date of Patent: Jan. 3, 2023

(54) SCANNING ELECTRON MICROSCOPY SYSTEM AND PATTERN DEPTH MEASUREMENT METHOD

(71) Applicant: Hitachi High-Tech Corporation, Tokyo (JP)

(72) Inventors: Takahiro Nishihata, Tokyo (JP); Mayuka Osaki, Tokyo (JP); Takuma Yamamoto, Tokyo (JP); Akira Hamaguchi, Tokyo (JP); Yusuke Iida, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/043,140

(22) PCT Filed: Apr. 5, 2019

(86) PCT No.: PCT/JP2019/015151
§ 371 (c)(1),
(2) Date: Sep. 29, 2020

(87) PCT Pub. No.: WO2019/194305
PCT Pub. Date: Oct. 10, 2019

(65) Prior Publication Data
US 2021/0027983 A1 Jan. 28, 2021

(30) Foreign Application Priority Data
Apr. 6, 2018 (JP) .............................. JP2018-073717

(51) Int. Cl.
*H01J 37/28* (2006.01)
*H01J 37/22* (2006.01)
*H01J 37/244* (2006.01)

(52) U.S. Cl.
CPC ............ *H01J 37/28* (2013.01); *H01J 37/222* (2013.01); *H01J 37/244* (2013.01);
(Continued)

(58) Field of Classification Search
CPC ........ H01J 37/28; H01J 37/222; H01J 37/244; H01J 2237/24475; H01J 2237/24571;
(Continued)

(56) References Cited

U.S. PATENT DOCUMENTS 4,767,926 A 8/1988 Murakoshi et al.
5,212,028 A 5/1993 Fujino
(Continued)

FOREIGN PATENT DOCUMENTS

JP S631910 A 1/1988
JP H04149944 A 5/1992
(Continued)

OTHER PUBLICATIONS

Search Report dated Jun. 25, 2020 in corresponding International Application No. PCT/JP2019/015151.
(Continued)

*Primary Examiner* — David A Vanore
(74) *Attorney, Agent, or Firm* — Miles & Stockbridge, P.C.

(57) ABSTRACT

A scanning electron microscopy system that includes a primary electron beam radiation unit configured to irradiate a first pattern of a substrate having a second pattern formed in a peripheral region of the first pattern, a detection unit configured to detect back scattered electrons emitted from the substrate, an image generation unit configured to generate an electron beam image corresponding to a strength of the back scattered electrons, a designating unit configured to designate a depth measurement region in which the first pattern exists on the electron beam image, and a processing
(Continued)

unit configured to obtain an image signal of the depth measurement region and a pattern density in the peripheral region where the second pattern exists, and to estimate a depth of the first pattern based on the obtained image signal of the depth measurement region and the pattern density in the peripheral region.

5 Claims, 11 Drawing Sheets

(52) U.S. Cl.
CPC ........... *H01J 2237/24475* (2013.01); *H01J 2237/24571* (2013.01); *H01J 2237/2817* (2013.01)

(58) Field of Classification Search
CPC ....... H01J 2237/2817; H01J 2237/2804; H01J 2237/281; H01J 2237/221; H01J 37/3026; G01N 23/2251; H01L 22/12; G01B 15/02
See application file for complete search history.

(56) References Cited

U.S. PATENT DOCUMENTS

| | | | |
|---|---|---|---|
| 5,412,210 A * | 5/1995 | Todokoro | G01B 15/04 250/306 |
| 5,434,409 A | 7/1995 | Tsubusaki | |
| 5,493,403 A | 2/1996 | Nishi | |
| 5,552,602 A * | 9/1996 | Kakibayashi | G01N 23/046 250/311 |
| 5,831,273 A | 11/1998 | Someda et al. | |
| 5,912,467 A | 6/1999 | Okino | |
| 5,912,469 A | 6/1999 | Okino | |
| 6,399,945 B1 | 6/2002 | Hirayanagi | |
| 6,734,429 B2 * | 5/2004 | Takagi | H01J 37/026 250/306 |
| 6,946,656 B2 * | 9/2005 | Ezumi | G01N 23/2251 250/306 |
| 7,483,560 B2 | 1/2009 | Shishido et al. | |
| 8,481,934 B2 * | 7/2013 | Ezumi | H01J 37/26 250/310 |
| 8,788,242 B2 | 7/2014 | Matsuoka et al. | |
| 9,472,376 B2 | 10/2016 | Yokosuka et al. | |
| 2005/0173633 A1 | 8/2005 | Tanaka et al. | |
| 2006/0002604 A1 | 1/2006 | Sakai et al. | |
| 2006/0202119 A1 | 9/2006 | Yamada et al. | |
| 2008/0203298 A1 | 8/2008 | Ishijima et al. | |
| 2009/0212215 A1 | 8/2009 | Nagatomo et al. | |
| 2009/0214103 A1 | 8/2009 | Tanaka et al. | |
| 2012/0037801 A1 | 2/2012 | Mochizuki et al. | |
| 2012/0126116 A1 | 5/2012 | Tanaka et al. | |
| 2012/0305767 A1 | 12/2012 | Toyoda et al. | |
| 2013/0216141 A1 | 8/2013 | Ushiba et al. | |
| 2014/0021348 A1 | 1/2014 | Hoque et al. | |
| 2014/0070099 A1 | 3/2014 | Aliman et al. | |
| 2014/0175279 A1 | 6/2014 | Agemura | |
| 2014/0217274 A1 | 8/2014 | Wang et al. | |
| 2016/0035538 A1 * | 2/2016 | Fukuda | H01J 37/285 250/307 |
| 2016/0117847 A1 | 4/2016 | Pandev et al. | |
| 2016/0307730 A1 | 10/2016 | Namai et al. | |
| 2016/0379798 A1 | 12/2016 | Shishido et al. | |
| 2018/0033588 A1 | 2/2018 | Kumamoto et al. | |
| 2018/0182595 A1 | 6/2018 | Yokosuka et al. | |
| 2019/0362933 A1 * | 11/2019 | Takagi | G01N 21/9501 |
| 2021/0012998 A1 * | 1/2021 | Nishihata | H01J 37/244 |
| 2021/0027455 A1 | 1/2021 | Kimizuka et al. | |
| 2021/0043420 A1 | 2/2021 | Ohashi et al. | |

FOREIGN PATENT DOCUMENTS

| | | |
|---|---|---|
| JP | 2003157790 A | 5/2003 |
| JP | 2006119133 A | 5/2006 |
| JP | 2008218014 A | 9/2008 |
| JP | 2010175249 A | 1/2010 |
| JP | 201330277 A | 2/2013 |
| JP | 201333671 A | 2/2013 |
| JP | 201345500 A | 3/2013 |
| JP | 5313939 B2 | 10/2013 |
| JP | 2014130077 A | 7/2014 |
| JP | 5619118 B2 | 11/2014 |
| JP | 2015106530 A | 6/2015 |
| JP | 2017103363 A | 6/2017 |

OTHER PUBLICATIONS

Written Opinion dated Jun. 25, 2020 in corresponding International Application No. PCT/JP2019/015151.
International Preliminary Examination Report dated Jun. 25, 2020 in International Application No. PCT/JP2019/015148.
Search Report dated Jun. 25, 2020 in International Application No. PCT/JP2019/015148.
Written Opinion dated Jun. 25, 2020 in International Application No. PCT/JP2019/015148.

* cited by examiner

[FIG. 1]
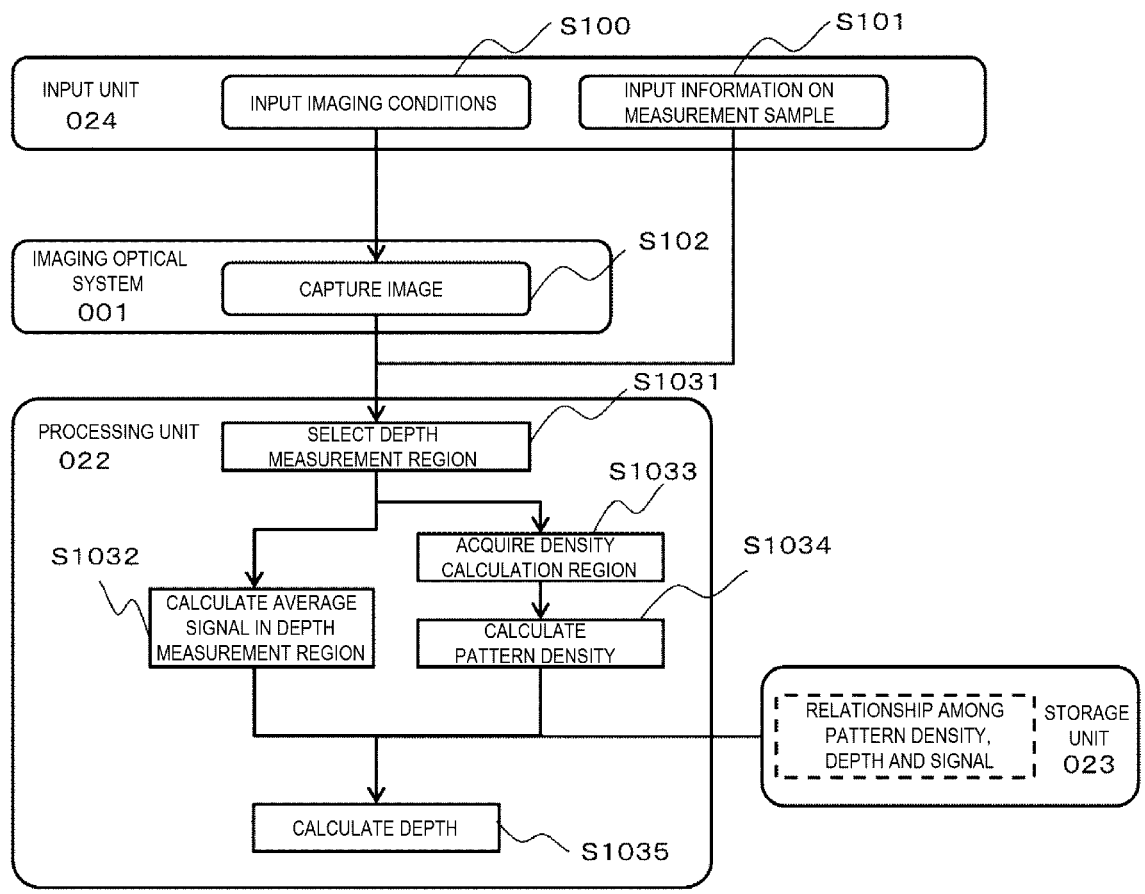

[FIG. 2]
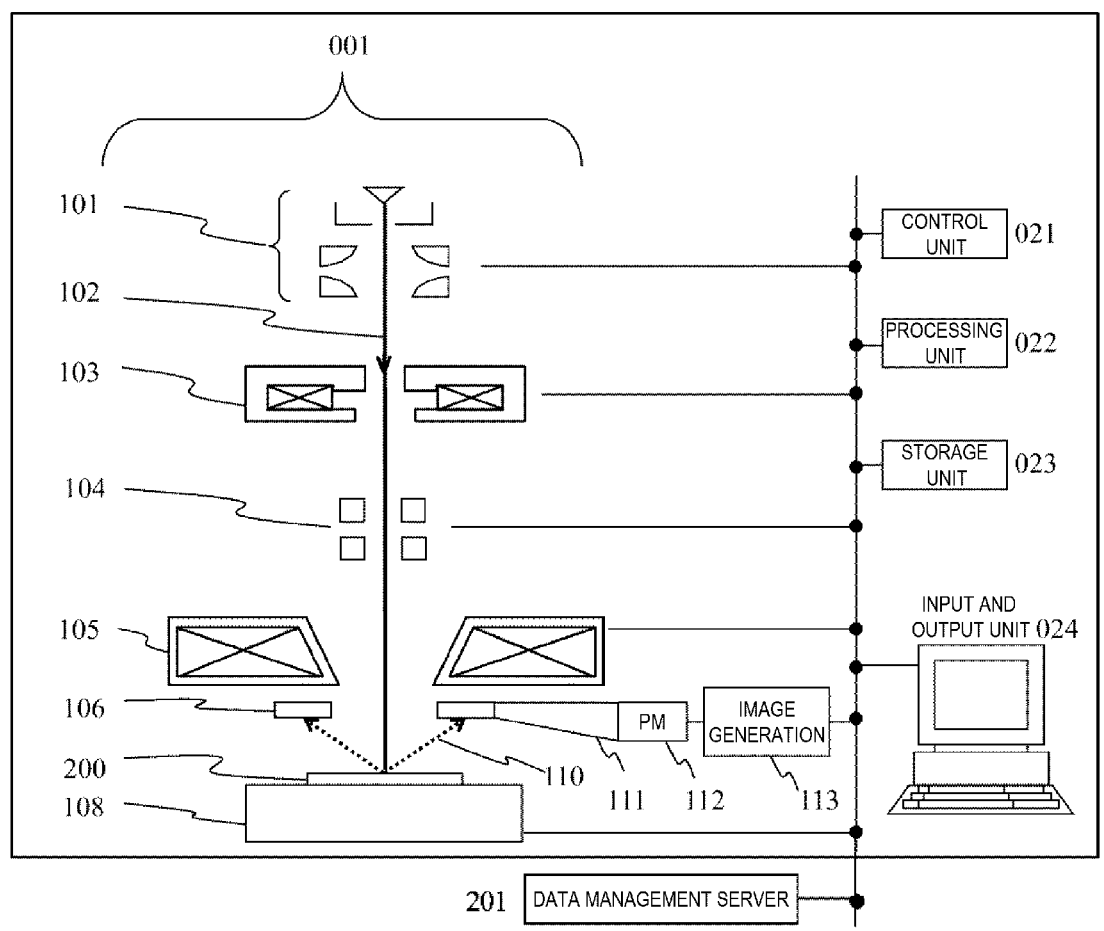
[FIG. 3A]
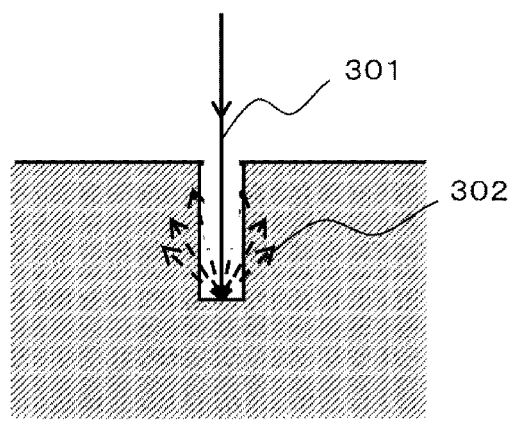

[FIG. 3B]
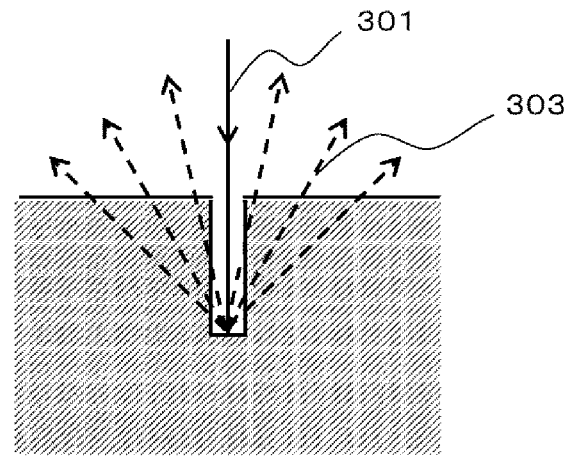
[FIG. 3C]
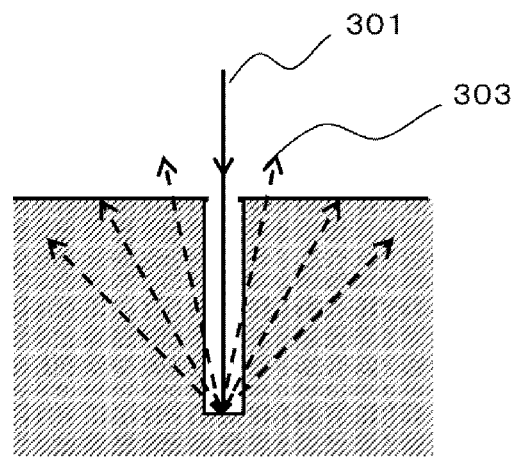
[FIG. 3D]
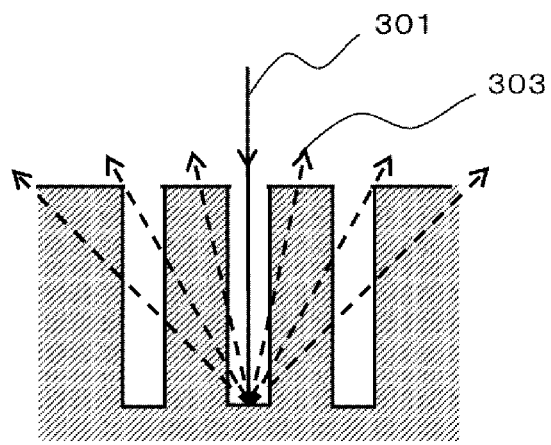

[FIG. 4]
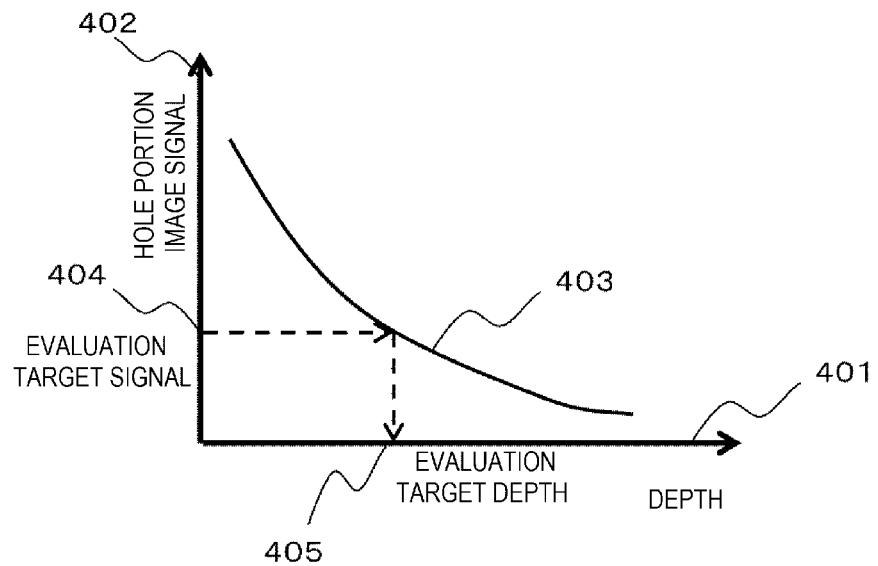
[FIG. 5A]
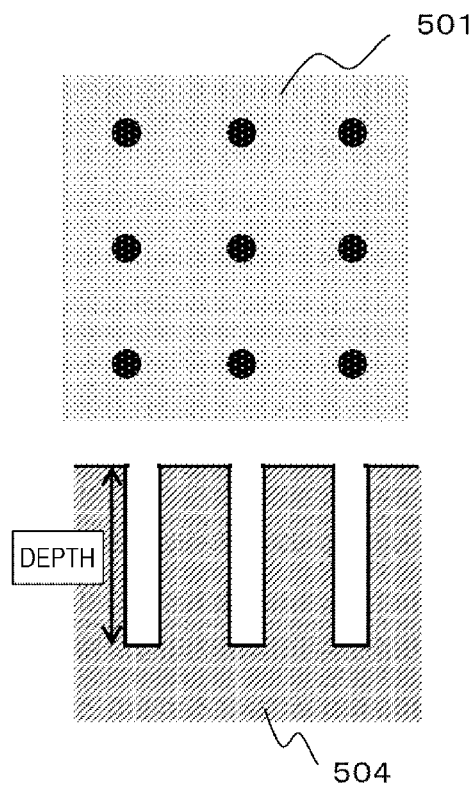

[FIG. 5B]
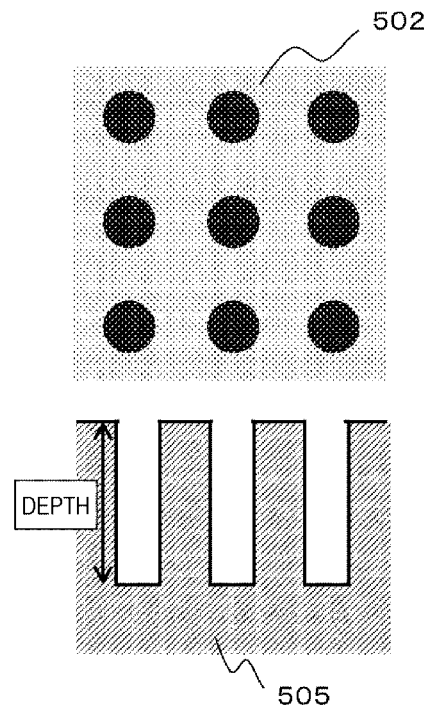
[FIG. 5C]
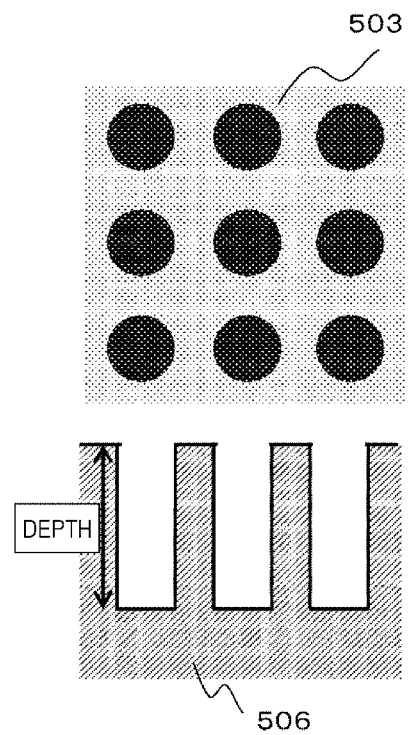

[FIG. 5D]
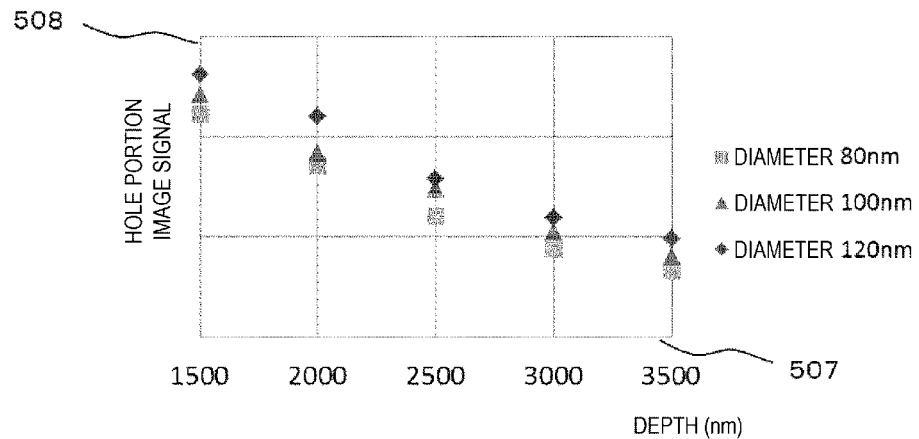
[FIG. 5E]
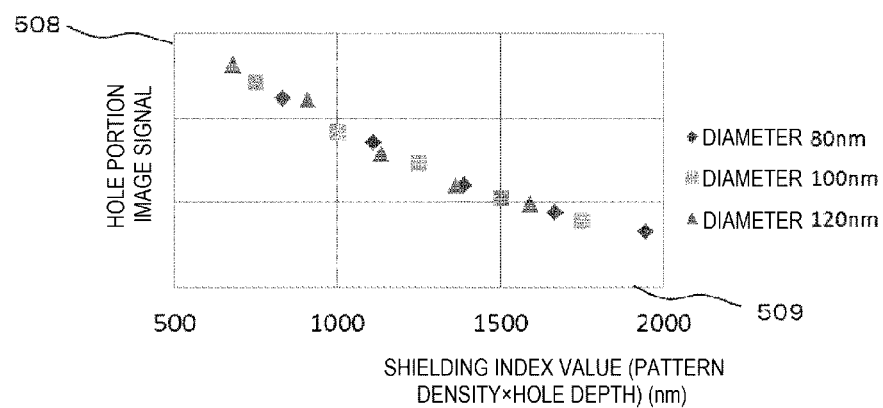
[FIG. 6]
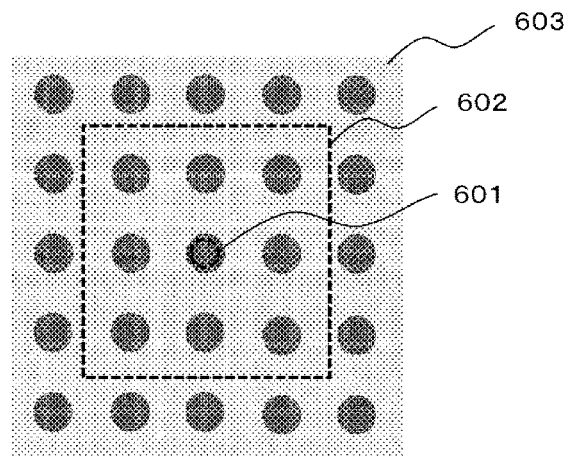

[FIG. 7]
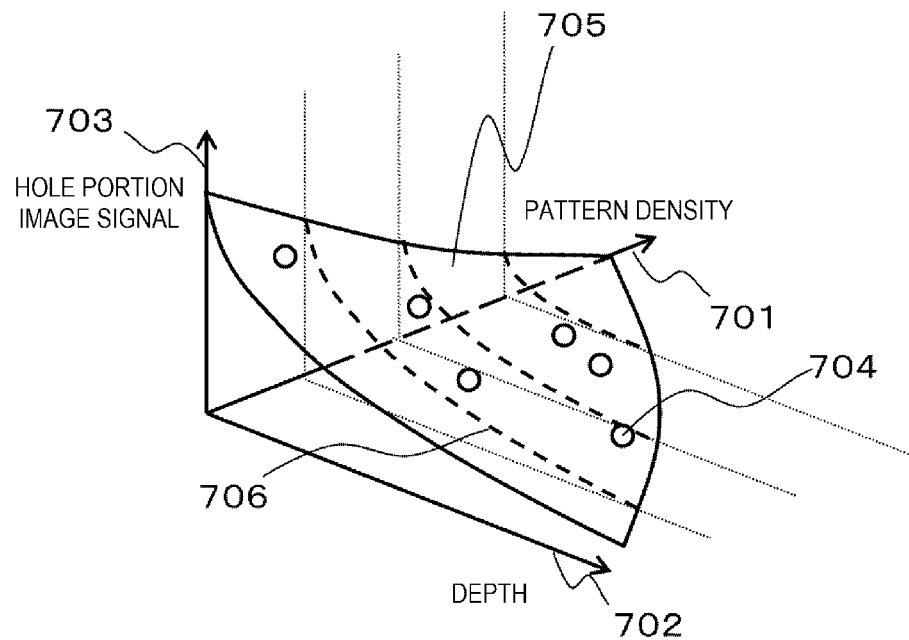
[FIG. 8]
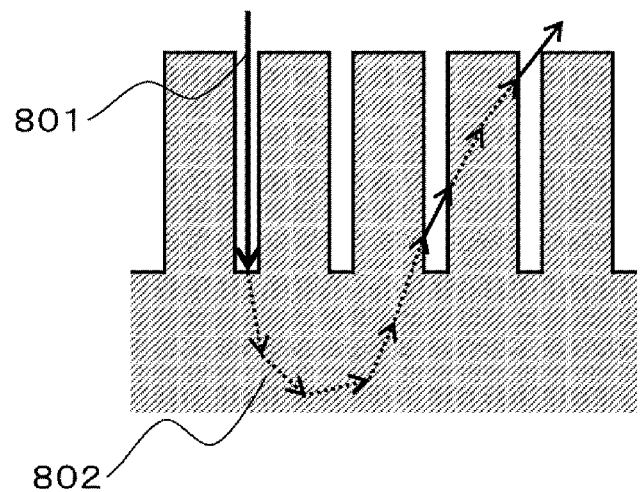

[FIG. 9]
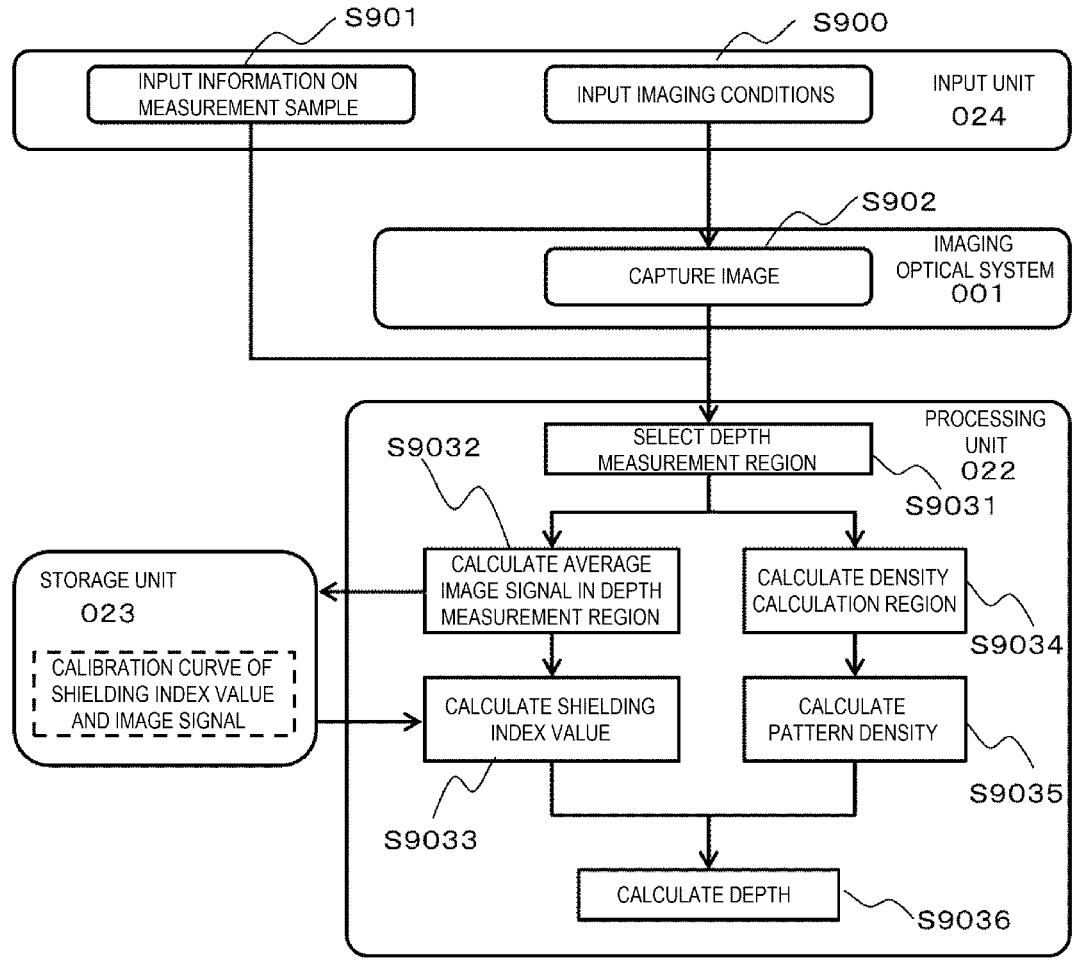
[FIG. 10]
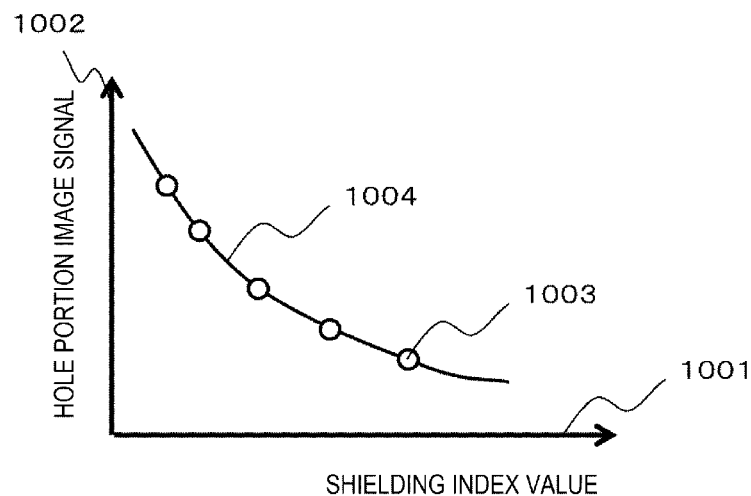

[FIG. 11]
[FIG. 12]
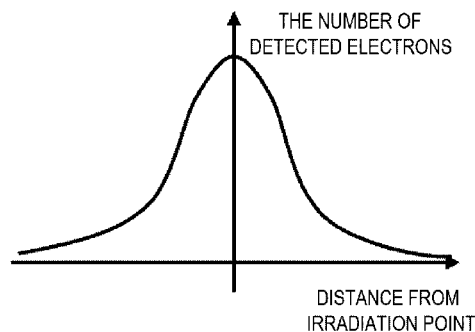
[FIG. 13A]
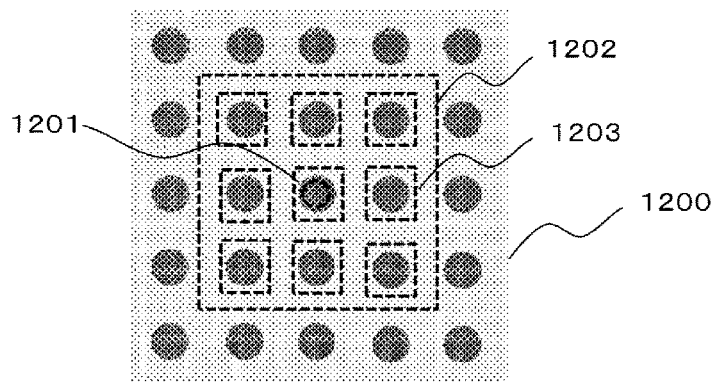
[FIG. 13B]

[FIG. 14]
| IMAGING CONDITION | |
|---|---|
| MAGNIFICATION | |
| ACCELERATION VOLTAGE | |
| BEAM CURRENT | |
| FRAME SUM NUMBER | |
| SCAN SPEED | |
[FIG. 15]
| OUTPUT INFORMATION | |
|---|---|
| IMAGE SIGNAL | |
| PATTERN DENSITY | |
| DEPTH | |
[FIG. 16A]
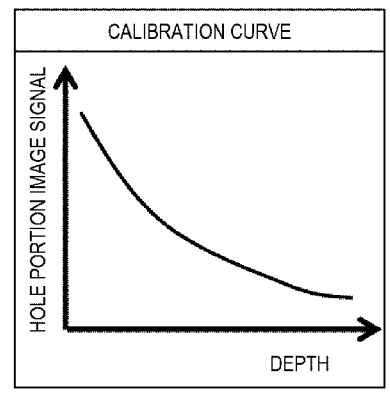
[FIG. 16B]
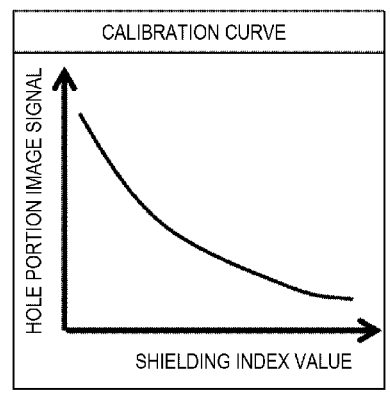

[FIG. 17]
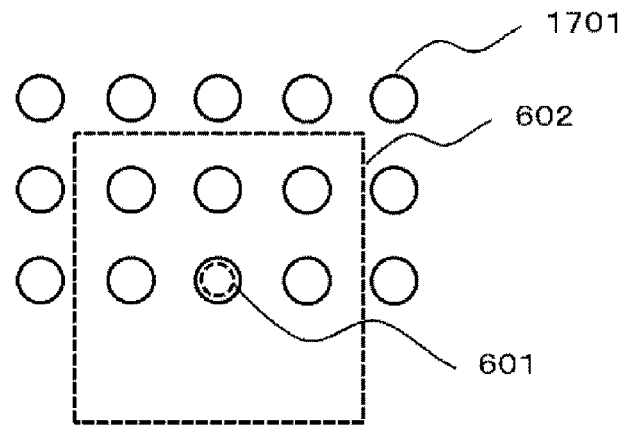
[FIG. 18]
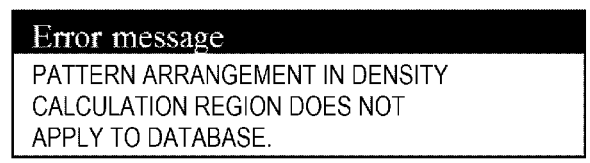

SCANNING ELECTRON MICROSCOPY SYSTEM AND PATTERN DEPTH MEASUREMENT METHOD

TECHNICAL FIELD

The present invention relates to a scanning electron microscopy system and a pattern depth measurement method.

BACKGROUND ART

A scanning electron microscopy (SEM) is widely used to measure a dimension of a pattern (for example, a concave pattern of a side wall of a hole) in a semiconductor manufacturing process. For example, PTL 1 discloses a technique for measuring the dimension of such a concave pattern. In PTL 1, by irradiating a hole bottom with a primary electron beam, high energy back scattered electrons (BSE) capable of passing through the side wall of the hole are generated, information on the hole bottom is acquired by detecting the back scattered electrons, and the dimension of the concave pattern is measured.

CITATION LIST

Patent Literature

PTL 1: JP-A-4-149944

SUMMARY OF INVENTION

Technical Problem

In recent NAND flash memories, technology for stacking memory cell arrays to be three-dimensional (3D-NAND) has been increasingly developing. In the 3D-NAND, a plurality of holes are adjacent to each other, and a plurality of concave patterns are formed.

When there is one hole in an electron range (a maximum moving distance that electrons can pass through a sample), and when multiple holes are adjacent in the electron range, a proportion of solid in a peripheral region of an evaluation object varies due to the existence of the hole in the peripheral region of the evaluation object. As a result, distances at which the BSE pass through the solid are different. Accordingly, the number of BSE that can escape to the outside of the sample is different, and a difference occurs in a detection signal at the hole bottom. In general, since a semiconductor pattern changes not only in depth but also in hole diameter depending on process variation, the pattern density of the peripheral region of the evaluation object changes and the detection signal also changes. As a result, an error occurs in a depth measurement of the concave pattern.

PTL 1 is targeted to a semiconductor substrate on which only one concave pattern is formed, and refers to a relationship between a depth of a concave pattern and a signal of back scattered electrons (BSE signal) when one concave pattern is formed. However, PTL 1 is not targeted to a semiconductor substrate (such as 3D-NAND) in which a plurality of holes are adjacent to each other and a plurality of concave patterns are formed, and does not refer to a depth measurement error caused when the peripheral pattern density is different in a semiconductor substrate having a plurality of concave patterns.

An object of the invention to provide a scanning electron microscopy system and a pattern depth measurement method that can reduce a depth measurement error.

Solution to Problem

A scanning electron microscopy system according to an aspect of the invention includes: a primary electron beam radiation unit configured to irradiate a first pattern of a substrate having a second pattern formed in a peripheral region of the first pattern with a primary electron beam; a detection unit configured to detect back scattered electrons emitted from the substrate irradiated with the primary electron beam by the primary electron beam radiation unit; an image generation unit configured to generate an electron beam image corresponding to a strength of the back scattered electrons detected by the detection unit; a designating unit configured to designate a depth measurement region in which the first pattern exists on the electron beam image generated by the image generation unit; and a processing unit configured to obtain an image signal of the depth measurement region and a pattern density in the peripheral region where the second pattern exists, and estimate a depth of the first pattern in the depth measurement region based on the obtained image signal of the depth measurement region and the pattern density in the peripheral region.

A pattern depth measurement method according to the aspect of the invention includes: an irradiation step of irradiating a first pattern of a substrate having a second pattern formed in a peripheral region of the first pattern with a primary electron beam; a detection step of detecting back scattered electrons emitted from the substrate irradiated with the primary electron beam in the irradiation step; an image generation step of generating an electron beam image corresponding to a strength of the back scattered electrons detected in the detection step; a designation step of designating a depth measurement region in which the first pattern exists on the electron beam image generated in the image generation step; and a processing step of obtaining an image signal of the depth measurement region and a pattern density in the peripheral region where the second pattern exists, and estimating a depth of the first pattern in the depth measurement region based on the obtained image signal of the depth measurement region and the pattern density in the peripheral region.

Advantageous Effect

According to the invention, a depth measurement error can be reduced.

BRIEF DESCRIPTION OF DRAWINGS

FIG. 1 is a flowchart showing a depth measurement method according to a first embodiment.

FIG. 2 is a block diagram showing a configuration of a scanning electron microscopy system.

FIG. 3A is a cross-sectional view schematically showing a behavior of SE generated when a primary electron beam is emitted to a bottom of a hole pattern.

FIG. 3B is a cross-sectional view schematically showing a behavior of BSE generated when the primary electron beam is emitted to the bottom of the hole pattern.

FIG. 3C is a cross-sectional view schematically showing a behavior of BSE generated when the primary electron beam is emitted to a bottom of a hole pattern deeper than that in FIG. 3B.

FIG. 3D is a cross-sectional view schematically showing a behavior of BSE generated when the primary electron beam is emitted to a bottom of a dense hole pattern having the same depth as FIG. 3C.

FIG. 4 is a diagram schematically showing a relationship 403 between a depth 401 of a hole and a detection signal 402 when the primary electron beam is emitted to a hole bottom.

FIG. 5A is a top view and a sectional view of a dense hole pattern having a diameter of 80 nm and a pitch of 200 nm.

FIG. 5B is a top view and a sectional view of a dense hole pattern having a diameter of 100 nm and a pitch of 200 nm.

FIG. 5C is a top view and a sectional view of a dense hole pattern having a diameter of 120 nm and a pitch of 200 nm.

FIG. 5D is a graph showing a relationship between a depth of a hole and an image signal of a hole portion when depths of the samples in FIGS. 5A to 5C are changed.

FIG. 5E is a graph showing a relationship between a shielding index value of the hole and the image signal of the hole portion when the depths of the samples of FIGS. 5A to 5C are changed.

FIG. 6 is a diagram showing an example of a density calculation region for a dense hole pattern.

FIG. 7 is a graph showing a relationship between an image signal at a bottom of a hole pattern for each pattern density and a depth of a hole.

FIG. 8 is a diagram showing an example of behavior in a solid of electrons shoot in a hole bottom of the dense hole pattern.

FIG. 9 is a flowchart showing a depth measurement method according to a second embodiment.

FIG. 10 is a graph showing a relationship between an image signal at a bottom of a hole pattern and a depth of a shielding index value.

FIG. 11 is a diagram showing a distribution of the number of detected electrons relative to a distance from an irradiation point on a pattern surface when the hole bottom of the dense hole pattern is irradiated with an electron beam.

FIG. 12 is a diagram showing a user interface according to first to third embodiments, and is a diagram showing a measurement box for designating a depth measurement region and a pattern to be measured.

FIG. 13A is a diagram showing the user interface according to the first to third embodiments, and is a diagram showing a material specifying box for specifying a side wall film material and a bottom material.

FIG. 13B is a diagram showing the user interface according to the first to third embodiments, and is a diagram showing a sample selection box for selecting measurement sample information set in advance.

FIG. 14 is a diagram showing the user interface according to the first to third embodiments, and is a diagram showing an imaging condition display box at a time of imaging.

FIG. 15 is a diagram showing the user interface according to the first to third embodiments, and is a diagram showing a measurement result display box.

FIG. 16A is a diagram showing the user interface according to the first to third embodiments, and is a diagram showing a calibration curve display box of a depth and an image signal used for depth measurement.

FIG. 16B is a diagram showing the user interface according to the second and third embodiments, and is a diagram showing a calibration curve display box of a depth and a shielding index value used for depth measurement.

FIG. 17 is a diagram showing the user interface according to the first to third embodiments, and is a diagram showing a positional relationship display box of a layout of a semiconductor pattern on design data, a depth measurement region, and a density calculation region.

FIG. 18 is a diagram showing the user interface according to the first to third embodiments, and is a diagram showing an alarm display box for issuing an alarm when a pattern arrangement or a density does not satisfy applicable conditions of a database prepared in advance.

DESCRIPTION OF EMBODIMENTS

First, embodiments of the invention will be described with reference to the drawings. The embodiments of the invention relate to a method of detecting BSE generated when a sample is irradiated with an electron beam at a high acceleration voltage, and estimating a depth using a detection signal.

In a pattern dimension management in the semiconductor manufacturing process, a length measurement SEM obtained by specializing a scanning electron microscopy (SEM) for semiconductors is widely used. The length measurement SEM is a device that detects a secondary electron (SE) having low energy (for example, energy less than 50 eV) generated from a surface of a sample when the sample is irradiated with the primary electron beam, and uses a SE signal for measurement. In the length measurement SEM, the dimension of a concave pattern is measured using a fact that the SE signal has surface shape information such as the side wall of the hole.

When an evaluation object is a high aspect ratio hole as shown in the cross-sectional view of FIG. 3A, SE 302 generated when a primary electron beam 301 is emitted to a hole bottom are stopped by the side wall of the hole and cannot escape due to low energy. Therefore, with a length measurement SEM in the related art, information on the hole bottom cannot be acquired.

Therefore, as shown in FIG. 3B, high energy back scattered electrons (BSE) 303 that are capable of passing through the side wall of the hole are generated by irradiating the hole bottom with the primary electron beam 301 at a higher acceleration voltage than the length measurement SEM in the related art. Information on the hole bottom can be acquired by detecting the back scattered electrons.

In general, the longer a distance at which the electrons pass through the solid, the more energy the electrons lose. Accordingly, as shown in FIG. 3C, the deeper the hole is, the longer the in-solid passing distance of the BSE is, the smaller the proportion of the BSE 303 that can escape is, and the smaller the detection signal is.

FIG. 4 is a diagram schematically showing a relationship 403 between a depth 401 of the hole and a detection signal 402 when the primary electron beam is emitted to the hole bottom. By investigating the relationship in advance and using it as a calibration curve, it is possible to obtain a depth 405 of the hole from a hole portion signal 404 of the evaluation object.

The BSE generated when the primary electron beam are emitted to the hole bottom spread radially around an irradiation position of the primary electron beam, and are detected after passing through a wide range of solid corresponding to the electron range (a maximum moving distance that the electrons can pass through the sample). In order to detect the BSE generated at the hole bottom, since the range of the BSE is captured under a condition that the range of the BSE is equal to or larger than the depth of the hole, it is considered that when measuring the depth of the hole having a depth of several μm, the depth measurement target is affected by a pattern in a range of several μm. That is, even in the case of holes having the same depth, when there is one hole in the range as shown in FIG. 3C, and when multiple holes are adjacent to each other within the range as shown in the cross-sectional view in FIG. 3D, the proportion of the surrounding solid differs, and distances at which the BSE pass through the solid vary. Accordingly, the number of BSE that can escape to the outside of the sample is different, and a difference occurs in the detection signal at the hole bottom.

In general, since the semiconductor pattern changes not only in depth but also in hole diameter depending on process variation, a density of a periphery of the evaluation target changes and the detection signal also changes. Therefore, when a target to be used when creating the calibration curve and a target to be used when measuring the depth have different peripheral pattern density, a depth measurement error occurs. Therefore, in the embodiments of the invention, it is possible to measure the depth in which the depth measurement error due to the influence of the pattern density in the periphery of the depth measurement region is reduced.

Specifically, as shown in FIG. 2, a scanning electron microscopy system 100 includes a substrate (sample 200) having a second pattern formed in a peripheral region of a first pattern, a primary electron beam radiation unit (electron gun 101) that irradiates the first pattern formed on the substrate (sample 200) with the primary electron beam, a detection unit (YAG scintillator 106) that detects back scattered electrons (BSE 110) emitted from the substrate (sample 200) irradiated with the primary electron beam 102 by the primary electron beam radiation unit (electron gun 101), an image generation unit 113 that generates an electron beam image corresponding to a strength of the back scattered electrons (BSE 110) detected by the detection unit (YAG scintillator 106), a designating unit (input and output unit 024) that designates a depth measurement region in which the first pattern exists on the electron beam image generated by the image generation unit 113, and a processing unit 002 that obtains an image signal of the depth measurement region and the pattern density in the peripheral region where the second pattern exists and estimates the depth of the first pattern in the depth measurement region based on the obtained image signal of the depth measurement region and the pattern density in the peripheral region.

Hereinafter, embodiments for achieving the modes of the invention will be described with reference to the drawings.

First Embodiment (Device Configuration)

FIG. 2 is an example of a basic configuration of a scanning electron microscopy system to which the invention is applied. An electron microscope system 100 includes an imaging optical system 001, a control unit 021, the processing unit 022, a storage unit 023, and the input and output unit 024. The primary electron beam 102 having a high acceleration voltage (for example, 30 kV) is generated from the electron gun 101, the primary electron beam 102 is focused by condenser lenses 103, and is further focused on the surface of the sample 200 by passing through objective lenses 105.

The primary electron beam 102 two-dimensionally scans the sample 200 by deflectors 104. The BSE 110 at a low angle (low angle relative to a horizontal plane) emitted from the sample 200 are received by the annular YAG scintillator 106, converted into an optical signal, guided to a photomultiplier tube (PM) 112 by an optical fiber 111, and a digital image is generated by the image generation unit 113. At this time, the image signal is standardized so that a signal amount of the detected BSE corresponding to an irradiation amount of the electron beam can be compared between different captured images. Alternatively, the irradiation amount of the electron beam and adjustment parameters used when converting the detected BSE signal into the image signal are held first, and the image signal is standardized when the image signal necessary for subsequent depth measurement is calculated so that the signal amount of the detected BSE corresponding to the irradiation amount of the electron beam can be compared between different captured images. The captured images are stored in the storage unit 023. By moving a stage 108, image capturing can be performed at any position of the sample 200.

The control unit 021 controls a voltage applied to the periphery of the electron gun 101, a focus position adjustment of the condenser lenses 103 and the objective lenses 105, a movement of the stage 108, an operation timing of the image generation unit 113, and the like. The processing unit 022 performs dimension measurement processing using the captured images. An input of imaging conditions, an input of information on imaging target necessary for depth measurement, an output of a dimension measurement result, and the like are performed by the input and output unit 024. The scanning electron microscopy system 100 may share a network with an external design data management server 201 responsible for design data management and the like to construct a system.

(Image Acquisition)

The high energy BSE 110 are emitted from the sample 200 by irradiating the sample 200 with the primary electron beam 102 with high energy (high acceleration voltage) using the configuration shown in FIG. 2. For example, when a Si substrate is irradiated with the primary electron beam 102 accelerated at a voltage of 30 kV, the BSE pass through the Si substrate by about 6 µm. The emitted BSE 110 penetrate the side wall of the hole formed in the sample 200 and reach the annular scintillator 106. Accordingly, an image having information on the structure of the hole portion is obtained.

(Description of Principle and Effect)

A result of confirming an influence of the pattern density in the peripheral of a measurement portion on the image signal by electron beam simulation (Monte Carlo simulation) will be described with reference to FIGS. 5A to 5D.

FIGS. 5A to 5C show top views (501, 502, 503) and cross-sectional views (504, 505, 506) of samples in which hole patterns with diameters of 80, 100, and 120 nm are uniformly aligned at equal pitches. Although three rows and three columns of hole patterns are shown in the drawings, the hole patterns are actually arranged at regular intervals in a range in which the BSE diffuse.

FIG. 5D shows results of plotting the relationship between a depth 507 of a hole and an image signal 508 at the hole portion when the depths of the samples in FIGS. 5A to 5C are varied. The acceleration voltage at the time of imaging was set to 30 kV.

It can be seen from FIG. 5D that the larger the diameter of the hole is, the larger the image signal is, and the smaller the diameter is, the smaller the image signal is. That is, even if the depths are the same, the image signal at the bottom of the hole pattern varies depending on the diameter of the hole pattern. The above indicates that, since the larger the diameter of the hole is, the smaller a proportion of the solid in the sample, that is, the density is, the distance at which the BSE pass through the solid decreases and the BSE easily escape.

In consideration of the result, the relationship among the density and depth of the hole pattern and the image signal is set into a database and stored in the storage unit 032 in advance, and the depth is measured from the density of the pattern to be measured and the image signal of the hole portion.

(Procedure)

The depth measurement method according to the first embodiment will be described with reference to the flowchart of FIG. 1. Imaging conditions such as an imaging magnification and an acceleration voltage are input from the input unit 024 of the scanning electron microscopy system 100 shown in FIG. 2 (S100), and further, measurement sample information such as a material, a structure, and a depth measurement region of the sample 200 is input (S101).

Next, an electron beam image of the sample 200 is acquired based on the condition input by the imaging optical system 001 (S102). An electron beam image obtained by imaging the sample 200 by the imaging optical system 001 is input into the processing unit 022. The processing unit 022 selects a depth measurement region in accordance with depth measurement region information registered in advance in the measurement sample information input in S101 on the obtained electron beam image (S1031). Next, an average image signal in the measurement region is calculated (S1032).

Next, the density calculation region is acquired in order to calculate the pattern density in the periphery of the measurement region (S1033). Here, an example of an electron beam image 603, a specified depth measurement region 601, and a calculated density calculation region 602 when the dense hole pattern is imaged in FIG. 6 are shown.

(Density Calculation Region Calculation)

A region in which the density is to be taken into consideration in the depth measurement is a range calculated based on the range of the BSE determined by the acceleration voltage input in the input step (S100) of the imaging conditions and the material of the object selected in the input step (S101) of the measurement sample information, and is set to, for example, a circle, a rectangle, or the like. Since the range of the BSE is strictly influenced by the pattern structure, the pattern structure or the like may be taken into consideration in the calculation of the density calculation region 602.

In addition to calculating the density calculation region 602 for each depth measurement as described above, a representative value calculated in advance may be stored as the measurement sample information, and may be read at the time of depth measurement.

When the evaluation target has a periodic pattern arrangement within a range of the range of the BSE, the density calculation region acquisition step (S1033) may be omitted, and the density in a pattern region for one cycle may be calculated in a next pattern density calculation step (S1034).

(Density Calculation)

After acquiring the density calculation region 602 in S1033, the pattern density in the region is calculated (S1034). The pattern density represents the proportion of the solid in the density calculation region 602. When obtaining the pattern density, although it is necessary to consider a taper of the pattern or the like, in the present embodiment, the taper is assumed to be almost vertical, and a depth measurement method targeting a sample having a constant pattern density in a depth direction is described.

(Density Calculation 1 Using Measurement Result)

As a method of calculating the pattern density, there is a method of measuring a dimension of each pattern relative to the acquired image and calculating the pattern density based on the obtained measurement value. Various techniques in related art can be applied to the dimension measuring method. For example, when the hole diameter is measured by a threshold method, a signal waveform traversing the hole to be measured is acquired, a smoothing processing is performed to remove noise, and a position corresponding to an appropriate threshold based on positions of a maximum value and a minimum value of a signal waveform is obtained. The hole diameter can be obtained from the position.

The dimension measurement is performed for each pattern in the density calculation region 602, and the pattern density is calculated based on the obtained measurement value. For example, the pattern density in the rectangular density calculation region 602 shown in FIG. 6 is obtained by Expression 1 when the measurement value of the diameter of each hole pattern is set to $\varphi_i$ and lengths of horizontal and vertical sides of the density calculation region are set to $s_x$ and $s_y$.

$$\frac{\left(s_x * s_y - \sum_{i=1}^{9} \pi * \left(\frac{\phi_i}{2}\right)^2\right)}{s_x * s_y} \quad \text{[Expression 1]}$$

(Density Calculation 2 Binarization According to Threshold)

As a method other than method 1, a method is also considered in which a binarization processing is performed on the electron beam image at an appropriate threshold of a signal, regions of a surface portion and a hole portion are separated, and the pattern density may be calculated from an area of the density calculation region 602 and an area of the pattern surface portion.

Although an example in which the density of the density calculation region 602 is calculated using an electron microscope image is shown in the embodiment, since it is assumed that the density calculation region 602 is a wider range than a field of view of the captured image of the pattern to be measured, an optical microscope image including the density calculation region 602 for density calculation may be separately acquired, and the density may be calculated using the image.

(Density Calculation 3 Using Design Data)

In addition to the method using the electron beam image, a method of calculating the density from design data including dimension information and layout information of the semiconductor pattern is also considered. For example, the design data of the semiconductor pattern may be input to the processing unit 022 from an external design data management computer 201 connected to the scanning electron microscopy system 100 shown in FIG. 2, and the density may be calculated.

(Density Calculation 4 Evaluation Suitability Determination)

When the density of the calculated density calculation region 602 is calculated, the pattern arrangement and the calculated density are verified whether to satisfy a condition to which a database prepared in advance is applicable, and when the condition is not satisfied, an alarm is considered to be issued on a GUI. For example, when using a database assuming a periodic pattern arrangement and the pattern arrangement in the density calculation region 602 is not periodic, a fact that the region is not suitable for evaluation can be displayed.

(Depth Measurement)

Next, the depth depending on the calculated pattern density and the image signal is calculated from a relationship among the pattern density, the depth and the image signal set into a database in advance in the storage unit 023 (S1035).

(Database)

A database of the relationship among the pattern density, the depth and the image signal used here will be described. As a method of creating the database, there is a method of using a standard sample in which the pattern density and the depth of the hole change in a stepwise manner. An image signal and a pattern dimension such as a hole diameter or a pitch of the hole portion is acquired by imaging the standard sample, and the depth of the hole is obtained by a cross-sectional analysis or the like. As shown in FIG. 7, the relationship among a pattern density 701, a depth 702, and an image signal 703 obtained from the hole diameter, the pitch, and the like is stored as a database.

An approximated curved surface 705 for obtained data 704 may be calculated, and the calculated approximate curved surface 705 may be used in the database. Alternatively, a relationship between the depth and the image signal for each density may be functionalized (706) by an appropriate function such as a linear function, a quadratic function, or an exponential function by interpolation processing of the obtained data 704, and the relationship may be used in the database.

When it is difficult to prepare the standard sample or when the cross-sectional analysis is difficult, the database may be created using a simulation.

Using such a database, the value of depth depending on the image signal of the depth measurement target and the pattern density is calculated by interpolation processing or the like.

The first embodiment described above is a basic configuration of the embodiments of the invention. According to the first embodiment, the depth can be measured with high accuracy by reducing the influence of the pattern density in the periphery of the measurement portion. Although the hole pattern is described in the first embodiment as a target, the invention can also be applied to a pattern having another concave shape such as a groove pattern.

Second Embodiment

The second embodiment will describe a method of using a database storing a relationship between an index value and an image signal represented by a function of depth and pattern density, instead of using a database storing the relationship among the pattern density, the depth and the image signal described in the first embodiment. A configuration of a scanning electron microscopy system used in the embodiment is the same as the configuration of the scanning electron microscopy system 100 shown in FIG. 2 described in the first embodiment.

(Principle Description)

As described above, the longer a distance at which electrons pass through the solid is, the more energy thereof is lost, and the energy disappears when being zero. Therefore, it is considered that a detection signal depends on an in-solid passing distance of the electrons.

FIG. 8 schematically shows an example of behavior of electrons 801 shoot in a hole bottom of a dense hole pattern. It is considered that electrons detected among the electrons shoot in the hole bottom penetrate the solid, cause back scatter, pass through a hole pattern region, and exit from a target surface. At the time, it is considered that the in-solid passing distance of the electrons indicated by a dotted line 802 in FIG. 8 becomes longer as the hole becomes deeper, and becomes longer as the hole diameter becomes smaller and the pattern density becomes higher. That is, the in-solid passing distance can be represented using the pattern depth and the pattern density.

(Description of Index Value)

Therefore, an index value is defined using the pattern depth and the pattern density that can represent the in-solid passing distance of the electrons, and the relationship between the index value and the image signal of the hole portion is set into a database, and the depth is measured using the relationship. The index value is temporarily defined as a shielding index value.

The shielding index value is represented, for example, by a product of the pattern depth and the pattern density. Alternatively, the shielding index value is represented by, a product of weighted values corresponding to either or both of the pattern depth and the pattern density.

(Description of Effect)

The relationship between the shielding index value expressed by the product of the pattern depth and the pattern density and the image signal of the hole portion is shown in FIG. 5E. FIG. 5E shows the relationship between a shielding index value 509 and an image signal 508 at the hole portion when the depths of the samples in FIGS. 5A to 5C are changed. In FIG. 5D, although the relationship between the pattern depth and the image signal of the hole portion varies for each pattern density, it can be seen that a horizontal axis is set as the shielding index value and the pattern density and the pattern depth are on the same curve. In the second embodiment, the relationship between the shielding index value and the image signal of the hole portion is used in the depth measurement.

(Procedure)

The depth measurement method according to the second embodiment will be described with reference to the flowchart of FIG. 9. Imaging conditions such as an imaging magnification and an acceleration voltage is input from the input unit 024 of the scanning electron microscopy system 100 shown in FIG. 2 (S900), and further, measurement sample information such as a material, a structure, and a depth measurement region of the sample 200 is input (S901).

Next, an image of the sample 200 is acquired based on conditions input by the imaging optical system 001 (S902). The image signal obtained by imaging the sample 200 by the imaging optical system 001 is input into the processing unit 022. The processing unit 022 selects the measurement region in accordance with the depth measurement region information registered in advance in the measurement sample information input in S901 from the obtained image signal (S9031). Then, an average image signal in the measurement region is calculated (S9032). A shielding index value corresponding to the average image signal is calculated by using a database of a relationship between the shielding index value and the image signal stored in the storage unit 023 (S9033).

(Database)

A database of the relationship between the shielding index value and the image signal used here will be described. As a method of creating the database, a method similar to that described in the first embodiment can be used. However, since the database to be created is a relationship between the shielding index value and the image signal, the shielding index value is obtained from the pattern density and the depth, and the relationship between the shielding index value and the image signal is set into a database. The relationship between a shielding index value 1001 and an image signal 1002 of the hole portion stored as a database in FIG. 10 is shown by plots 1003. The obtained data may be approximated by an appropriate function, for example, a linear function, a quadratic function, or an exponential function, and used in a database.

When it is difficult to prepare the standard sample or when the cross-sectional analysis is difficult, the database may be created using a simulation. Using the database, a shielding index value corresponding to the calculated average image signal is calculated by interpolation processing or the like.

(Density Calculation)

In order to calculate a pattern density in the periphery of the selected measurement region, a density calculation region is calculated (S9034), and a pattern density in the region is calculated (S9035). The procedures are the same as those in the first embodiment (S1033) and (S1034).

(Depth Calculation)

Next, a depth is calculated from the calculated shielding index value represented by the depth and the pattern density, and the pattern density (S9036). Since the shielding index value is defined by a function of the pattern depth and the pattern density, for example, the product of the pattern depth and the pattern density, the pattern depth is calculated from the shielding index value and the pattern density according to the function.

In the second embodiment, although an absolute value is used as the value of the depth, a relative depth change depending on a depth of a flat portion of a pattern surface relative to a depth of a hole pattern serving as a reference may be used instead of the absolute value. Specifically, when the database is created, the shielding index value and the image signal are obtained with the depth of an evaluation point serving as a reference set to 1 and the depth of the flat portion of the pattern surface set to 0. At the time of measurement, a shielding index value corresponding to the image signal is calculated using the database, and the relative depth to a depth of a reference point is calculated from the shielding index value and the pattern density.

In the second embodiment described above, since there is only one database variable less than that in the first embodiment, it is considered that a database with a small error even at the same data point number can be created and thereby a depth measurement accuracy can be improved. In particular, the method is effective when a sample having a variation in pattern density or depth for creating a database cannot be prepared. Similar as in the first embodiment, the second embodiment is also applicable to a pattern having a concave shape other than the hole pattern.

Third Embodiment

In the third embodiment, a method of calculating the pattern density in consideration of the weight corresponding to a distance from a measurement point in the pattern density calculation in the first embodiment and the second embodiment (S1034 in FIG. 1 and S9035 in FIG. 10) will be described.

(Principle Description)

FIG. 11 is a diagram showing a distribution of the number of detected electrons relative to a distance on the pattern surface from the irradiation point of the electron beam when electrons are shoot in a hole bottom of a dense hole pattern. Since the in-solid passing distance of the electrons increases as the electrons become away from the irradiation position, it is considered that the electrons that can escape, that is, the detected electrons, are reduced. That is, since more electrons are detected in a region closer to the irradiation point, it is considered that the pattern density in the region has a strong influence on the detection signal.

(Weighting)

Therefore, it is considered to use a pattern density that is weighted corresponding to the distance from the irradiation point. In a local coordinate system $(r, \theta)$ according to a distance r and an azimuth angle $\theta$ from the irradiation point with the irradiation point as a center, when a pattern density distribution of an imaging target is set to $\rho(r, \theta)$ and a weighting function is set to $w(r, \theta)$, the pattern density is calculated by an inner product of the functions. The pattern density distribution $\rho(r, \theta)$ of the imaging target may be provided with a pattern surface portion as 1, a hole portion as 0, and a density in an appropriate region such as a diffusion range of electrons at each point.

(Weighting Function Calculation)

As a method of obtaining the weighting function, for example, a method of obtaining a distribution of detection signals corresponding to distances from irradiation points using a simulation, and approximating the distribution by an appropriate function such as a Gaussian function is considered.

Fourth Embodiment

The fourth embodiment shows a user interface for executing the embodiments of the invention. It is necessary to create a recipe specifying various conditions in advance in order to automatically perform the measurement described in the first embodiment to the third embodiment. In this recipe, as shown in FIG. 12, a pattern density calculation region 1202 determined based on a depth measurement region 1201 by designating the depth measurement region 1201 is displayed on a screen of the input and output unit 024.

In addition to a measurement box 1200 for designating a measurement cursor 1203 for pattern density calculation, a material specifying box for specifying a side wall film material and a hole bottom material shown in FIG. 13A and a sample selection box for selecting preset measurement sample information shown in FIG. 13B are displayed on the screen of the input and output unit 024.

Further, in an imaging condition setting box shown in FIG. 14, a measurement result output box shown in FIG. 15, a calibration curve display box of the depth and the image signal used in the depth measurement shown in FIG. 16A in the first embodiment to the third embodiment, and a calibration curve display box of the shielding index value and the image signal used in the depth measurement in the second embodiment and the third embodiment are displayed on the screen of the input and output unit 024.

When the scanning electron microscopy system 100 of FIG. 2 is connected to the external design data management server via a network, a positional relationship display box of a semiconductor pattern layout 1701, the depth measurement region 601, and the density calculation region 602 on the design data shown in FIG. 17 is displayed on the screen of the input and output unit 024.

Further, the pattern arrangement and the calculated density are verified whether to satisfy a condition to which a database prepared in advance is applicable, and when the condition is not satisfied, an alarm display box for issuing an alarm shown in FIG. 18 is displayed on the screen of the input and output unit 024.

According to the fourth embodiment, items requiring user input can be specified to execute the embodiments of the invention. An input item includes, a depth measurement region, a material (side wall, hole bottom), a sample recipe, imaging conditions and the like, and an output includes the image signal, the pattern density, the depth (dimension value) and the like. The display of the input and output unit 024 on the screen can be performed alone or in combination with one or a plurality of a depth measurement region, a density calculation region, a dimension measurement cursor, a calibration curve, design data, and an alarm.

REFERENCE SIGN LIST 001 imaging optical system
021 control unit
022 processing unit
023 storage unit
024 input and output unit
100 scanning electron microscopy system
101 electron gun
102 primary electron beam
103 condenser lens
104 deflector
105 objective lens
106 annular scintillator
108 stage
110 low angle BSE
111 optical fiber
112 photomultiplier tube
113 image generation unit that generates low angle BSE image
200 sample

The invention claimed is:

1. A pattern depth measurement method comprising:
an irradiation step of irradiating a first pattern of a substrate having a second pattern formed in a peripheral region of the first pattern with a primary electron beam;
a detection step of detecting back scattered electrons emitted from the substrate irradiated with the primary electron beam in the irradiation step;
an image generation step of generating an electron beam image corresponding to a strength of the back scattered electrons detected in the detection step;
a designation step of designating a depth measurement region in which the first pattern exists on the electron beam image generated in the image generation step; and
a processing step of obtaining an image signal of the depth measurement region and a pattern density in the peripheral region where the second pattern exists, and estimating a depth of the first pattern in the depth measurement region based on the obtained image signal of the depth measurement region and the pattern density in the peripheral region.

2. The pattern depth measurement method according to claim 1, wherein
the first pattern in the depth measurement region and the second pattern in the peripheral region are concave patterns formed in the substrate.

3. The pattern depth measurement method according to claim 1, wherein
a pattern density in the peripheral region is a proportion of a solid in the substrate in the peripheral region.

4. The pattern depth measurement method according to claim 1, further comprising:
a storing step of storing in advance in a database a relationship among an image signal of the depth measurement region, a depth of the first pattern in the depth measurement region, and a pattern density in the peripheral region, wherein
the processing step obtains the depth of the first pattern in the depth measurement region corresponding to the image signal of the obtained depth measurement region and the pattern density in the peripheral region with reference to the database.

5. The pattern depth measurement method according to claim 4, wherein
in the storing step, a relationship between a depth of the first pattern in the depth measurement region and a pattern density in the peripheral region for each of a plurality of types of the first pattern is stored in advance in the database.

* * * * *